United States Patent
Salfelder et al.

(10) Patent No.: US 7,040,966 B2
(45) Date of Patent: May 9, 2006

(54) CARBONATION OF PH CONTROLLED KOH SOLUTION FOR IMPROVED POLISHING OF OXIDE FILMS ON SEMICONDUCTOR WAFERS

(75) Inventors: Joseph F. Salfelder, Pleasant Valley, NY (US); Wayne Swart, Tivoli, NY (US); Gopalakrishna B. Prabhu, San Jose, CA (US); Srinivas R. Mirmira, San Jose, CA (US); Laertis Economikos, Wappingers Falls, NY (US); Fen Fen Jamin, Wappingers Falls, NY (US); Donald J. Delehanty, Wappingers Falls, NY (US); Daniel Heenan, North East, MD (US); Joseph M. Danza, Newburgh, NY (US)

(73) Assignees: Applied Materials, Santa Clara, CA (US); International Business Machine Corporation, Armonk, NY (US)

( * ) Notice: Subject to any disclaimer, the term of this patent is extended or adjusted under 35 U.S.C. 154(b) by 145 days.

(21) Appl. No.: 10/825,849

(22) Filed: Apr. 16, 2004

(65) Prior Publication Data

US 2005/0042877 A1   Feb. 24, 2005

Related U.S. Application Data

(60) Provisional application No. 60/463,358, filed on Apr. 16, 2003.

(51) Int. Cl.
   *B24B 1/00*   (2006.01)

(52) U.S. Cl. .................. 451/41; 451/285; 451/287; 438/691

(58) Field of Classification Search .............. 451/41, 451/285–289; 438/691
See application file for complete search history.

(56) References Cited

U.S. PATENT DOCUMENTS

| | | | |
|---|---|---|---|
| 5,759,378 A * | 6/1998 | Ferrier et al. ............... 205/159 |
| 6,066,030 A | 5/2000 | Uzoh | |
| 6,194,317 B1 | 2/2001 | Kaisaki et al. | |
| 6,234,870 B1 | 5/2001 | Uzoh et al. | |
| 6,238,592 B1 | 5/2001 | Hardy et al. | |
| 6,355,565 B1 * | 3/2002 | Feeney et al. ............ 438/691 |
| 2001/0008800 A1 * | 7/2001 | Koch ......................... 438/690 |
| 2003/0087524 A1 * | 5/2003 | Aoki et al. ................ 438/691 |

* cited by examiner

Primary Examiner—M. Rachuba
(74) Attorney, Agent, or Firm—Patterson and Sheridan

(57) ABSTRACT

A method and polishing system for planarizing a substrate having one or more materials formed thereon. The method generally includes positioning the substrate in proximity with a polishing pad, dispensing a polishing fluid to the polishing pad, the polishing fluid being subjected to carbonation prior to being dispensed to the polishing pad, and polishing the substrate. The polishing system generally includes a polishing platen having a polishing pad disposed thereon and in proximity to the substrate, a controller configured to cause the polishing pad to contact the substrate, and a polishing fluid delivery system to deliver a polishing fluid to the polishing pad, the polishing fluid delivery system including a carbonation system.

20 Claims, 1 Drawing Sheet

CARBONATION OF PH CONTROLLED KOH SOLUTION FOR IMPROVED POLISHING OF OXIDE FILMS ON SEMICONDUCTOR WAFERS

CROSS-REFERENCE TO RELATED APPLICATIONS

This application claims benefit of U.S. Provisional Patent Application Ser. No. 60/463,358, filed Apr. 16, 2003, which is incorporated herein by reference.

BACKGROUND OF THE INVENTION

1. Field of the Invention

Embodiments of the present invention generally relate to planarization of semiconductor devices and to methods and compositions for material removal.

2. Description of the Related Art

Multilevel interconnects are formed by the sequential deposition and removal of materials from a substrate surface to form conductive interconnect features. As layers of materials are sequentially deposited and removed, the uppermost surface of the substrate may become non-planar across its surface, thereby requiring planarization. Planarization, or "polishing" a surface, is a process where material is removed from the substrate surface to form a generally even, planar surface. Planarization is useful in damascene processes to remove excess deposited material and to provide an even surface for subsequent levels of metallization and processing. Planarization may also be used to remove undesired surface topography and surface defects such as rough surfaces, agglomerated materials, crystal lattice damage, scratches, and contaminated layers or materials.

Chemical mechanical planarization (CMP) systems generally utilize a polishing head to retain and press a substrate against a polishing surface of a polishing material while providing motion therebetween. A polishing fluid is generally disposed between the substrate and the polishing material during polishing to provide chemical activity to assist in removing material from the substrate. Some polishing fluids further contain abrasives to assist in removal.

CMP processes may utilize a fixed abrasive polishing pad, which contains fixed abrasive particles held in a containment medium, such as a backing sheet, and a plurality of geometric abrasive composite elements adhered to the containment medium.

One problem that is encountered is that fixed abrasive planarization may cause surface irregularities, such as scratches on the substrate surface. The abrasive treatment used to modify a substrate should be designed to simultaneously modify the metal and dielectric materials without scratching the surface of either material. Therefore, there is a need for a polishing fluid that will reduce surface irregularities.

SUMMARY OF THE INVENTION

Embodiments of the present invention generally include a method of planarizing a substrate having one or more materials formed thereon. The method generally includes positioning the substrate in proximity with a chemical mechanical polishing pad, dispensing a polishing fluid to the chemical mechanical polishing pad, the polishing fluid being subjected to carbonation prior to being dispensed to the chemical mechanical polishing pad, and chemical mechanical polishing the substrate.

Embodiments of the present invention further include a polishing fluid for a fixed abrasive polishing pad configured to remove materials formed on a substrate surface. The polishing fluid generally includes potassium hydroxide, deionized water, and carbon dioxide.

Embodiments of the present invention further provide a polishing system for planarizing one or more materials formed on a substrate surface. The polishing system generally includes a polishing platen having a fixed abrasive polishing pad disposed thereon and in proximity to the substrate, a controller configured to cause the fixed abrasive polishing pad to contact the substrate, and a polishing fluid delivery system to deliver a polishing fluid to the fixed abrasive polishing pad, the polishing fluid delivery system including a bubbling apparatus configured to carbonate the polishing fluid.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope.

DETAILED DESCRIPTION OF THE PREFERRED EMBODIMENT

Figure 1:
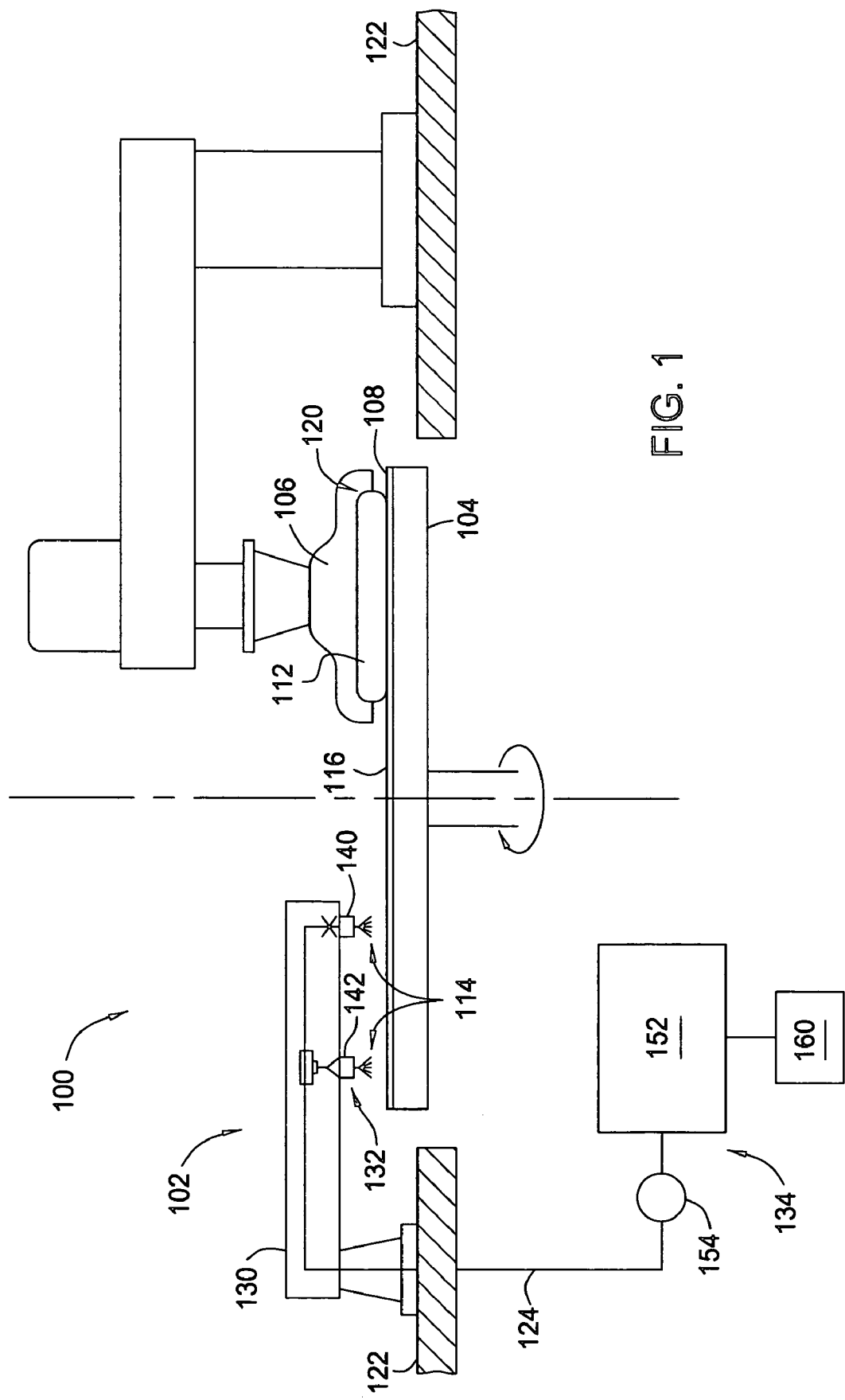
FIG. 1 illustrates a specific embodiment of a polishing system for polishing a substrate.

FIG. 1 illustrates a specific embodiment of a polishing system 100 for polishing a substrate 112. The substrate 112 may have one or more dielectric materials formed thereon. The dielectric materials may include silicon dioxide, silicon nitride, silicon oxy-nitride, phosphorus-doped silicon glass (PSG), boron-doped silicon glass (BSG), boron-phosphorus-doped silicon glass (BPSG), silicon dioxide derived from tetraethyl orthosilicate (TEOS), and silane, which are deposited by various chemical vapor deposition (CVD) techniques, and combinations thereof. The polishing system 100 generally includes a polishing fluid delivery system 102 to control the distribution of a polishing fluid 114 across a polishing material 108. Although the polishing fluid and its delivery system 102 are described in reference to the illustrative polishing system 100, the embodiments described below may be used in other polishing systems that utilize a polishing fluid.

Generally, the polishing system 100 includes a platen 104 and a polishing head 106. The platen 104 is generally positioned below the polishing head 106 that holds the substrate 112 during polishing. The platen 104 is generally disposed on a base 122 of the system 100 and coupled to a motor (not shown.) The motor rotates the platen 104 to provide at least a portion of a relative polishing motion between the polishing material 108 disposed on the platen 104 and the substrate 112. It is understood that relative motion between the substrate 112 and the polishing material 108 may be provided in other manners. For example, at least a portion of the relative motion between the substrate and the polishing material 108 may be provided by moving the polishing head 106 over a stationary platen 104, moving the polishing material linearly under the substrate 112, or moving both the polishing material 108 and the polishing head.

The polishing material 108 is generally supported by the platen 104 so that a polishing surface 116 faces upward towards the polishing head 106. Generally, the polishing material 108 is fixed to the platen 104 by adhesives, vacuums, or mechanical clamping during processing. Optionally, and particularly when the polishing material 108 is configured as a web, the polishing material 108 is releasably fixed to the platen 104, typically by use of a vacuum disposed between the polishing material 108 and the platen 104, as described in U.S. Pat. No. 6,244,935, the subject matter of which is hereby incorporated by reference.

The polishing material 108 is preferably a fixed abrasive material, although embodiments of the invention may be used with any polishing material. Fixed abrasive polishing materials are generally comprised of a plurality of abrasive particles suspended in a resin binder that is disposed in discrete elements on a backing sheet. Fixed abrasive polishing materials may be utilized in either pad or web form. As the abrasive particles are contained in the polishing material itself, systems utilizing fixed abrasive polishing materials generally utilize polishing fluids that do not contain abrasives. Examples of fixed abrasive polishing materials are disclosed in U.S. Pat. No. 5,692,950, issued Dec. 2, 1997 and U.S. Pat. No. 5,453,312, issued Sep. 26, 1995, both of which are hereby incorporated by reference.

The polishing head 106 generally is supported above the platen 104. The polishing head 106 retains the substrate 112 in a recess 120 that faces the polishing surface 116. The polishing head 106 typically moves toward the platen 104 and presses the substrate 112 against the polishing material 108 during processing. The polishing head 106 may be stationary or rotate, move orbitally, linearly or a combination of motions while pressing the substrate 112 against the polishing material 108.

The polishing fluid delivery system 102 generally includes a delivery arm 130, a plurality of nozzles 132 disposed on the arm 130 and at least one polishing fluid source 134. The delivery arm 130 is configured to dispense polishing fluid 114 at different locations along the arm 130 to control the distribution of polishing fluid 114 on the polishing surface 116 of the polishing material 108. As the polishing fluid 114 is generally supplied from a single source, the polishing fluid 114 is disposed on the polishing material 108 in a uniform concentration but in different locations along the width (or diameter) of the polishing material 108.

The delivery arm 130 is generally coupled to the base 122 proximate the platen 104. The delivery arm 130 generally has at least a portion that is suspended over the polishing material 108. The delivery arm 130 may be coupled to other portions of the system 100 as long as the portion is positionable to deliver polishing fluid 114 to the polishing surface 116. The plurality of nozzles 132 are disposed along the portion of the delivery arm 130 that is disposed above the platen 104. In one embodiment, the nozzles 132 comprise at least a first nozzle 140 and a second nozzle 142. Typically, the first nozzle 140 is positioned on the arm 130 radially inward of the second nozzle 142 relative to the center of rotation of the polishing material 108. The distribution of polishing fluid 114 across the polishing material 108 is controlled by selectively flowing polishing fluid 114 from either the first nozzle 140 or from the second nozzle 142, or from both the first nozzle 140 and the second nozzle 142. The polishing fluid 114 may be supplied to the polishing surface 116 at a flowrate of from about 5 mL/min to about 500 mL/min.

The polishing fluid source 134 is generally disposed externally to the system 100. In one embodiment, the polishing fluid source 134 generally includes a reservoir 152 and a pump 154. The pump 154 generally pumps the polishing fluid 114 from the reservoir 152 through the supply line 124 to the nozzles 132. The polishing fluid source 134 further includes a carbonation system 160.

In operation, the substrate 112 is positioned in the polishing head 106 and brought in contact with the polishing material 108 supported by the rotating platen 104. The polishing head 106 may hold the substrate stationary, or may rotate or otherwise move the substrate to augment the relative motion between the polishing material 108 and substrate 112. The polishing fluid delivery system 102 flows carbonated polishing fluid 114 through the supply line 124 to the first polishing nozzle 140. After a predetermined amount of material is removed from the substrate 112, the flow of polishing fluid 114 is stopped from the first nozzle 140 and started from the second nozzle 142. The change in location (i.e., distribution) of polishing fluid 114 on the polishing surface 116 results in a change in the local polishing rate across the width of the substrate.

Polishing Fluid

The carbonated polishing fluid 114 contained in the reservoir 152 generally includes one or more pH adjusting agents can be present in an amount sufficient to adjust the pH of the polishing fluid to provide a pH of from about 2.5 to about 12 and can include any of various bases, such as potassium hydroxide (KOH), or inorganic and/or organic acids, such as acetic acid, phosphoric acid or oxalic acid. The pH is adjusted based on the composition of the various components of the composition. Preferably, the pH adjusting agent is added in an amount sufficient to provide a pH of from about 9.5 to about 11.5. The polishing fluid may further include up to about 35 wt. % of abrasive particles, such as silica.

The polishing fluid may also include one or more buffers to increase the scratch performance, e.g., reduction of scratches, of the polishing fluid. In addition, buffers may be added to the polishing fluid to control the pH and thus mitigate pH changes caused by minor dilution from rinse water and/or the difference in the pH of the deionized water. As mentioned above, the pH can have a significant effect on the nature of the dielectric surface, and the dielectric removal rate. The buffer may include one or more organic compounds, which assist in selectively modifying the removal rate of one or more dielectric materials in relation to another dielectric material. Examples of organic compounds include amino acids having amino (—NH2) and carboxyl (—COOH) terminal ends, and derivatives thereof, such as glycine, proline, arginine, lysine, and combinations thereof. Preferably, the polishing solution includes L-proline. Polishing additives, for example, chelating agents and surfactants, may be added to the polishing composition.

Embodiments of the invention include carbonating the polishing fluid to further increase scratch performance, e.g., adding carbon dioxide ($CO_2$) to the polishing fluid. The polishing fluid may be carbonated in the reservoir 152 as shown in FIG. 1, or at any other time prior to contacting the polishing surface 116. The $CO_2$ may be added to the reservoir 152 by any carbonation system 160 known to one skilled in the art, such as via a bubbling apparatus having a conduit configured to deliver the $CO_2$ to the reservoir 152. A bubbling apparatus is generally operably connected to a gas regulator configured to control the gas flowrate into the tank. Generally the gas flowrate is from about 100 cc/min to about 1000 cc/min. The polishing fluid may be carbonated for a period of time from about 5 to about 1000 seconds. Preferably, the polishing fluid is carbonated for about 100 to about 660 seconds.

The pH of the polishing fluid may be remeasured upon carbonation and adjusted accordingly to obtain a desired pH level. For example, additional KOH may be added to the polishing fluid to obtain a polishing fluid pH of about 9.5 after carbonation.

The embodiments described above generally result in increased scratch performance. For example, a polishing fluid having a pH of 9.5 and which was carbonated for 600 seconds exhibited zero scratches. The surface finish of the substrate may be evaluated by methods known to one skilled in the art. For example, defects may be detected by the Orbot or Compass systems available from Applied Materials, Santa Clara, Calif.

While the foregoing is directed to embodiments of the present invention, other and further embodiments of the invention may be devised without departing from the basic scope thereof, and the scope thereof is determined by the claims that follow.

What is claimed is:

1. A method of planarizing a substrate having one or more materials formed thereon, comprising:
    positioning the substrate in proximity with a polishing pad;
    dispensing a polishing fluid to the polishing pad, the polishing fluid being subjected to carbonation prior to being dispensed to the polishing pad; and
    polishing the substrate.

2. The method of claim 1, wherein the polishing pad is a fixed abrasive polishing pad.

3. The method of claim 2, wherein the fixed abrasive polishing pad comprises a web.

4. The method of claim 1, wherein the polishing fluid comprises a pH adjusting agent.

5. The method of claim 4, wherein the pH adjusting agent is potassium hydroxide.

6. The method of claim 1, wherein the polishing fluid comprises a buffer compound.

7. The method of claim 1, wherein the polishing fluid has a pH of from about 7 to about 12.

8. The method of claim 1, wherein the polishing fluid has a pH of from about 9.5 to about 11.5.

9. The method of claim 1, wherein the polishing fluid is carbonated for a time from about 5 to about 1000 seconds.

10. The method of claim 1, wherein the polishing fluid is carbonated for a time from about 100 to about 650 seconds.

11. The method of claim 1, wherein the substrate has a first dielectric material and a second dielectric material formed thereon.

12. The method of claim 11, wherein the first dielectric material comprises an oxide.

13. The method of claim 12, wherein the second dielectric material comprises a nitride.

14. A method of planarizing a substrate having one or more materials formed thereon, comprising:
    positioning the substrate in proximity with a fixed abrasive polishing pad;
    dispensing a polishing fluid to the fixed abrasive polishing pad, the polishing fluid comprising potassium hydroxide and having a pH of from about 9.5 to about 11.5 and being subjected to carbonation for about 5 to about 1000 seconds prior to being dispensed to the fixed abrasive polishing pad; and
    polishing the substrate.

15. The method of claim 14, wherein the polishing fluid is subjected to carbonation for a time from about 100 to about 650 seconds.

16. A polishing fluid for a fixed abrasive polishing pad configured to remove materials formed on a substrate surface, comprising:
    potassium hydroxide;
    deionized water; and
    carbon dioxide.

17. The polishing fluid of claim 16, wherein the polishing fluid has a pH of from about 7 to about 12.

18. A polishing system for planarizing one or more materials formed on a substrate surface, comprising:
    a polishing platen having a polishing pad disposed thereon and in proximity to the substrate;
    a controller configured to cause the polishing pad to contact the substrate; and
    a polishing fluid delivery system adapted to deliver a polishing fluid to the polishing pad, the polishing fluid delivery system including a carbonation system.

19. The polishing system of claim 18, wherein the carbonation system is a bubbling apparatus.

20. The polishing system of claim 19, wherein the bubbling apparatus is operably connected to a gas regulator configured to control a gas flowrate into the polishing fluid.

* * * * *